Figure 1:
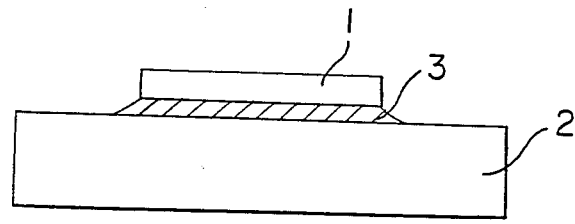

United States Patent [19]

Morishita et al.

[11] Patent Number: 4,848,646
[45] Date of Patent: Jul. 18, 1989

[54] METHOD FOR DEPOSITING SOLDER ONTO ALUMINUM METAL MATERIAL

[75] Inventors: Mitsuharu Morishita; Shiro Iwatani; Mitsuaki Nanba, all of Hyogo, Japan

[73] Assignee: Mitsubishi Denki Kabushiki Kaisha, Tokyo, Japan

[21] Appl. No.: 246,929

[22] Filed: Sep. 19, 1988

Related U.S. Application Data

[63] Continuation of Ser. No. 484,504, Apr. 13, 1983, abandoned.

[30] Foreign Application Priority Data

Apr. 26, 1982 [JP] Japan .................................. 57-72405

[51] Int. Cl.$^4$ ............................................. B23K 9/235
[52] U.S. Cl. .................................................. 228/206
[58] Field of Search ................. 228/206; 427/305, 328, 427/405, 259

[56] References Cited

U.S. PATENT DOCUMENTS

| | | | |
|---|---|---|---|
| 3,726,771 | 4/1973 | Coll-Palagos | 427/328 X |
| 3,909,209 | 4/1975 | Kruper et al. | |
| 3,982,055 | 9/1976 | Howard | 427/328 X |
| 4,076,575 | 2/1978 | Chang | 427/259 X |
| 4,122,215 | 10/1978 | Vratny | 427/328 X |
| 4,246,147 | 1/1981 | Bakos et al. | 427/259 X |
| 4,346,128 | 8/1982 | Loch | 427/405 X |
| 4,372,996 | 2/1983 | Guditz et al. | 427/328 |
| 4,400,415 | 8/1983 | Kessler et al. | 427/328 X |

FOREIGN PATENT DOCUMENTS

| | | |
|---|---|---|
| 2049542 | 4/1971 | Fed. Rep. of Germany . |
| 2452865 | 5/1975 | Fed. Rep. of Germany . |
| 1014271 | 7/1963 | United Kingdom . |
| 935262 | 8/1963 | United Kingdom . |
| 1386375 | 3/1973 | United Kingdom . |
| 1445553 | 8/1976 | United Kingdom . |
| 1525864 | 9/1978 | United Kingdom . |

OTHER PUBLICATIONS

AES Update, *Autocalalytic (Electrodes) Plating on Aluminum*, by Donald W. Baudrond, CEF, Dec. 1979.

*Primary Examiner*—M. Jordan
*Attorney, Agent, or Firm*—Oblon, Spivak, McClelland, Maier & Neustadt

[57] ABSTRACT

A method for depositing solder onto aluminum metal material comprises steps of:
(a) activating the surface of aluminum metal;
(b) substituting zinc for the surface of aluminum as activated;
(c) forming a nickel coating film over the surface of the zinc-substituted layer on the aluminum metal material by the non-electrode plating; and
(d) attaching soldering material onto the nickel coating film surface.

3 Claims, 1 Drawing Sheet

METHOD FOR DEPOSITING SOLDER ONTO ALUMINUM METAL MATERIAL

This application is a continuation of application Ser. No. 484,504, filed on Apr. 13, 1983, now abandoned.

This invention is concerned with a method for depositing readily and rigidly a soldering material onto aluminum metal material which is regarded as being unmanageably difficult to be joined with a solder.

In general, the soldering work to the aluminum metal has been shunned for the reasons that the surface of the aluminum metal is apt to be oxidized readily, that it tends to cause electrolytic corrosion, that it is rather difficult to form a solid-solution with the soldering material, and for other reasons. Accordingly, the aluminum metal, which gives rise to difficulty in the soldering work, has hardly been used for a heat sink-material, to which a semiconductor element, for example, is soldered, and, in most cases, such heat-sink material is made of cooper which facilitates such soldering.

Therefore, in the following, explanations, of a conventional example will be given with reference to a method for soldering a semiconductor element to a heat-sink made of copper, as a representative example. That is, as shown in FIG. 1 of the accompanying drawing, the semiconductor element 1 is soldered to the copper-made heat-sink 2 with the soldering material 3. Depending on the soldering condition, however, it occurs sometimes that copper ion is ionized from the copper-made heat-sink 2 during operations of the semiconductor device to give mal-effect to the electric characteristic of the semiconductor element 1. Further, since copper is a material of heavy weight and of high price, the semiconductor device to be assembled becomes inevitably heavy and expensive.

The reason for copper having been used as the material for the heat-sink in spite of its shortcomings is that aluminum which is light in weight and cheap in price is a material difficult to be joined with solder.

The present inventors have strenuously conducted studies and researches to develop a better method of depositing the soldering material onto aluminum metal material, as the result of which they have discovered that the soldering material can be deposited on aluminum metal material readily and rigidly in accordance with the following steps:

(A) activating the surface of aluminum metal material;

(B) substituting zinc of the activated surface of aluminum;

(C) forming nickel coating film on the zinc-substituted surface by the non-electrode plating method; and (D) causing the soldering material to be deposited onto the nickel coating film surface.

In this way, they have completed the present invention.

It is therefore an object of the present invention to provide a new method of depositing solder onto aluminum metal material in equal degree of readiness with other metallic materials which can be easily joined with solder.

According to the present invention, in general aspect of it, there is provided a method for depositing solder onto aluminum metal material, which comprises steps of: (a) activating the surface of aluminum metal material; (b) substituting zinc for the surface of aluminum as activated; (c) forming a nickel coating film over the surface of the zinc-substituted layer on the aluminum metal material by the non-electrode plating; and (d) attaching soldering material onto the nickel coating film surface.

The foregoing object, other objects as well as specific process steps for soldering aluminum metal material according to the present invention will become more apparent and understandable from the following detailed description thereof, when read in connection with an actual example thereof as well as the accompanying drawing.

Figure 2:
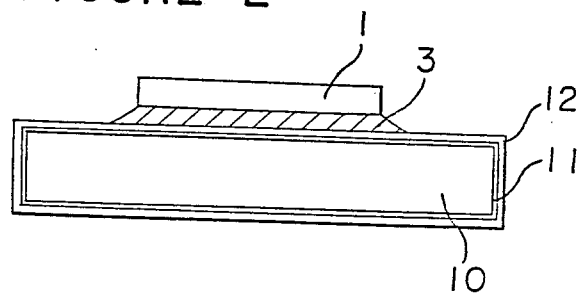
Figure 3:
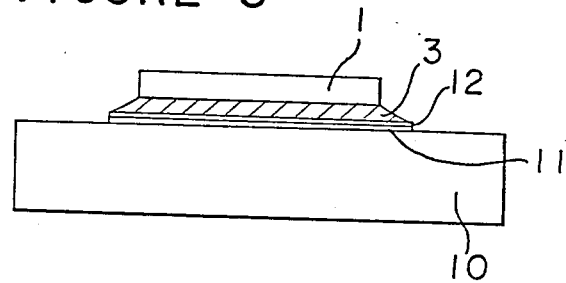

In the drawing:

FIG. 1 is a schematic cross-sectional view showing a semi-conductor device, in which semiconductor element has been soldered to a conventional heat-sink made of copper; and FIGS. 2 and 3 are schematic cross-sectional views of semiconductor devices to be fabricated by the method of the present invention.

In the following, the present invention will be described specifically in reference to FIGS. 2 and 3 as representative methods of soldering the semiconductor element to an aluminum-made heat-sink.

First of all, the surface activating treatment in the abovementioned step (A) may be done by applying a nitric acid solution to the heat-sink 10 in case it is made of pure aluminum, or by applying a mixed liquid of fluoric acid and nitric acid to the heat-sink in case it is made of an alloy of silicon and aluminum, or by applying a mixed liquid of sulfuric acid and nitric acid to the heat-sink in case it is made of an alloy of magnesium and aluminum, or by immersing the heat-sink into such treating liquid corresponding to the constituent material for each and every heat-sink.

The zinc-substituting treatment in the step (B) may be done on the activated surface of aluminum metal material in accordance with, for example, the zinc-substitution, zinc alloy-substitution, and so forth, all of which belong to the substitution-plating method. As the result of this, there is formed a zinc-substituted layer 11 on the surface of aluminum metal material.

In the following, a couple of examples of the plating bath will be given for the case of adopting the substitution-plating method. It should, however, be understood that the plating bath is not limited to these examples alone.

| Component | g/l |
| --- | --- |
| Plating Bath (I) | |
| Nickel sulfate | 30 |
| Zinc sulfate | 40 |
| Copper sulfate | 5 |
| Sodium hydroxide | 106 |
| Rochelle salt | 40 |
| Potassium prussiate | 10 |
| Ferric chloride | 2 |
| Plating Bath (II) | |
| Zinc oxide | 100 |
| Caustic soda | 525 |
| Rochelle salt | 10 |
| Ferric chloride | 10 |

Incidentally, it is feasible that the zinc-substituted layer which has once been formed is removed, and a fresh zinc-substituted layer is formed again in the same manner as mentioned above. Moreover, such layer forming may be done repeatedly.

The nickel-forming step (C) may be effected by the non-electrode plating method onto the surface of the zinc-substituted layer 11 obtained at the step (B), thereby forming the nickel coating film 12. Suitable plating liquid for the purpose may, for example, be of a boride type, a hypophosphorus acid type, and others.

By the way, the conditions for the plating operation to be done at the steps (B) and (C) may be those which are adopted in the usual plating works such as, for example, immersion of aluminum metal material for 10 to 60 seconds at 20° to 30° C. for the step (B), and immersion thereof for 10 to 60 seconds at 60° to 95° C. for the step (C). Then, the semiconductor element 1 may be soldered by a usual way onto the nickel coating film 12 formed in the above-mentioned manner.

When the method of the present invention is employed, aluminum in light weight can be used for the heat-sink, whereby the weight of the entire device can be reduced, and, further, since aluminum is of a low price, the manufacturing cost of the device can be reduced. Moreover, since aluminum can be worked easily, the plastic work of the heat-sink becomes easy. By the way, it should be understood that the nickel coating film 12 does in no way give unfavorable influence on the semiconductor element 1.

In the steps (B) and (C) of the method according to the present invention, both zinc-substituted layer 11 and nickel coating film 12 are formed. In these steps, the non-electrode process may be adopted, hence treatment of the aluminum metal material can be done with a simple installation and in a large quantity at once.

It should be noted that the zinc-substituted layer and the nickel coating film need not always be formed over the entire surface of the aluminum metal material, but may be formed only on those portions where the soldering is required. For this purpose, it may suffice that those portions other than those required to be soldered are masked with insulating layers, and then the zinc-substituted layer 11 and the nickel coating film 12 are formed on those required portions. FIG. 3 illustrates a schematic cross-section of the semiconductor device to be obtained in the above-mentioned manner.

According to this method, since the zinc-substituted layer 11 and the nickel coating film 12 are formed only at the portion where the soldering is to be done, there follow such advantages, in addition to those mentioned above, that zinc-substituted layer and the nickel coating film are not exposed on the portions of the metal material unnecessary to be soldered, and electrolytic corrosion due to potential gradient with aluminum constituting the heat-sink 10 can be prevented.

With a view to enabling those skilled in the art to put the present invention into practice, the following actual example will be given.

EXAMPLE

A heat-sink made of aluminum was immersed in a mixed liquid of fluoric acid and nitric acid (at a volume ratio of 50:30) for 5 to 10 seconds, thereby activating the surface of aluminum metal material. Subsequently, the heat-sink was immersed in the afore-mentioned plating bath (I) for 10 to 60 seconds to thereby form a zinc-substituted layer.

The thus treated heat-sink was then immersed in a boron-type plating bath of the following composition for one hour to thereby form a nickel coating film.

| Component | g/l |
|---|---|
| Nickel chloride | 30 |
| Nickel hydroxide | 40 |
| Ethylene diamine | 60 |
| Sodium fluoride | 3 |
| Sodium borohydride | 0.5 |

When a semiconductor element was soldered onto the thus formed nickel coating film, the soldering material was rigidly and readily adhered to the nickel coating film.

According to the method of the present invention, it is possible that the soldering work can be effected on the aluminum metal material, which is light in weight and cheap in price, only by activating the surface of aluminum, followed by forming of the zinc-substituted layer and the subsequent nickel coating film, and, moreover, the method is excellent in its practicability in that such treatment steps can be done in a simple installation and in a large quantity.

In the foregoing, the method of the present invention has been explained with principal reference to a case where it is applied to soldering of the semiconductor element to the heat-sink. It should, however, be noted that the method of the present invention is not only applicable to the above-mentioned case alone, but also to all cases of effecting the soldering to aluminum.

Although the present invention has been described in the foregoing with specific details in reference to a preferred example thereof, it should be noted that the invention is not limited to this example alone, but any changes and modifications may be made by those skilled in the art within the spirit and scope of the invention as recited in the appended claims.

I claim:

1. A method for depositing solder onto an aluminum metal material, which comprises the steps of:
    (a) activating the surface of the aluminum metal;
    (b) substituting zinc for the surface of the activated aluminum;
    (c) forming a nickel coating film over the surface of the zinc-substituted layer on the aluminum metal material by non-electrode plating; and
    (d) attaching a soldering material onto the nickel coating film surface;
   wherein step (a), steps (b) and (c), or steps (a), (b) and (c) are carried out on the portions of the aluminum metal material surface corresponding to where step (d) is to be carried out, the remaining portions of the aluminum metal material surface being masked by an insulating layer, and
   wherein step (a) comprises applying a mixture of sulfuric acid and nitric acid to the aluminum metal material.

2. A method for depositing solder onto an aluminum metal material, which comprises the steps of:
    (a) activating the surface of the aluminum metal;
    (b) substituting zinc for the surface of the activated aluminum;
    (c) forming a nickel coating film over the surface of the zinc-substituted layer on the aluminum metal material by non-electrode plating; and
    (d) attaching a soldering material onto the nickel coating film surface;
   wherein step (a), steps (b) and (c), or steps (a), (b) and (c) are carried out on the portions of the aluminum metal material surface corresponding to where step (d) is to be carried out, the remaining portions of the aluminum metal material surface being masked by an insulating layer, and wherein in step (b) the aluminum metal material is immersed for 10 to 60 seconds at 20° to 30° in the zinc plating solution.

3. A method for depositing solder onto an aluminum metal material, which comprises the steps of:
 (a) activating the surface of the aluminum metal;
 (b) substituting zinc for the surface of the activated aluminum;
 (c) forming a nickel coating film over the surface of the zinc-substituted layer on the aluminum metal material by non-electrode plating; and
 (d) attaching a soldering material onto the nickel coating film surface;

wherein step (a), steps (b) and (c), or steps (a), (b) and (c) are carried out on the portions of the aluminum metal material surface corresponding to where steps d) is to be carried out, the remaining portions of the aluminum metal material surface being masked by an insulating layer, and wherein in steps (c) the aluminum metal material is immersed for 10 to 60 seconds at 60° to 95° C. in the nickel plating solution.

* * * * *